United States Patent [19]
Evans et al.
[11] 3,902,923
[45] Sept. 2, 1975

[54] THERMOELECTRIC MATERIALS

[75] Inventors: John C. Evans, Midland; Grace Y-L. Lo, East Lansing, both of Mich.
[73] Assignee: The Dow Chemical Company, Midland, Mich.

[22] Filed: Sept. 10, 1973
[21] Appl. No.: 395,900

Related U.S. Application Data

[62] Division of Ser. No. 101,605, Dec. 28, 1970, abandoned.

[52] U.S. Cl. ................ 136/203; 136/236; 136/238; 62/3; 423/466; 423/472
[51] Int. Cl. ........................................ H01v 1/16
[58] Field of Search .......... 136/236, 238, 203; 62/3; 423/472, 466

[56] References Cited

UNITED STATES PATENTS 2,793,243 5/1957 Lindenblad ........................ 136/236
3,261,721 7/1966 Cornish ............................ 136/236

OTHER PUBLICATIONS

Sneed et al., "Comprehensive Inorganic Chemistry," Vol. IV, 1955 p. 100.
Mellor, "Comprehensive Treatise on Inorganic and Theoretical Chemistry," Vol. IV, 1946 pp. 839–844, 884–885.

*Primary Examiner*—Harvey E. Behrend
*Attorney, Agent, or Firm*—Edward E. Schilling

[57] ABSTRACT

Mercury oxychlorides have been discovered to possess thermoelectric properties. These materials are extrinsic, n-type semiconductors. They are particularly useful in heat pumps utilized for cooling applications. The mercury oxychlorides may be modified by the replacement of up to about 95 mole percent of the chlorine with another halogen.

4 Claims, 1 Drawing Figure

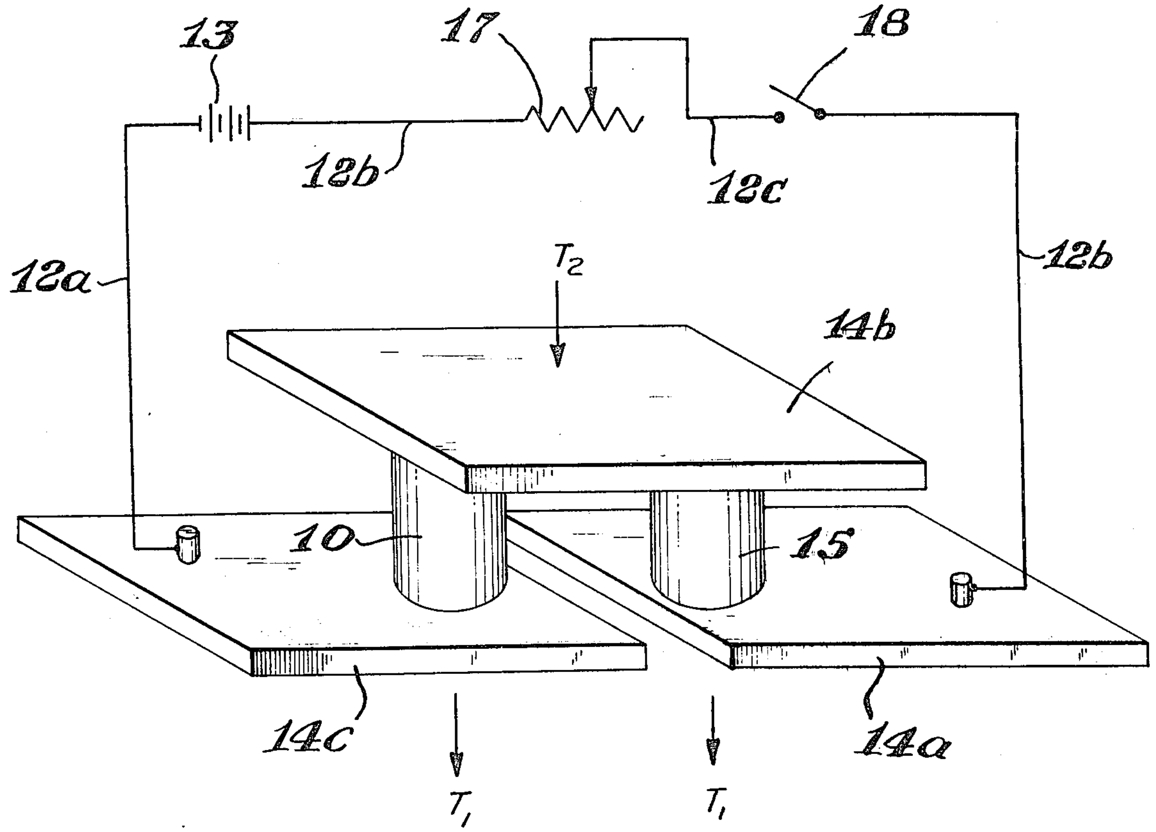
INVENTORS.
John C. Evans
Grace Y-L LO
BY William R. Norris
ATTORNEY

THERMOELECTRIC MATERIALS

CROSS-REFERENCE TO RELATED APPLICATION

This is a division of application Ser. No. 101,605 filed Dec. 28, 1970, now abandoned.

The combined use of n- and p-type thermoelectric elements to produce thermoelectricity and electrical cooling is a well known phenomenon. The technology of thermoelectrics, however, has not produced many practical devices and there is a continuing need for new thermoelectric devices which afford new performance properties.

It is an object of the instant invention to provide novel thermoelectric structures. A particular object is to provide a thermoelectric structure utilizing a new n-type semiconductor.

It is a further object of the instant invention to provide a thermoelectric structure useful as a cooling device.

DESCRIPTION OF THE INVENTION

According to the instant invention, a thermoelectric couple comprises two thermoelectric elements of semiconductor materials. The elements are electrically joined in series to form a thermoelectric junction. One of said elements is a conventional p-type semiconductor. For this purpose any of the known p-type materials can be employed. The n-type counterpart to the junction is a mercury oxychloride characterized by the following formula: $2HgO \cdot (Hg\,Cl_2)_b \cdot (HgX_2)_a$ wherein X is fluorine, bromine or iodine and $a$ is a number from 0 to 0.9 and $b$ is a number from 0.1 to 1 and $a + b = 1$. Preferably, $a$ is a number from 0.75 to 0.25 and $b$ is correspondingly a number from 0.25 to 0.75.

Refer to FIG. 1 of the accompanying drawings for further illustration of the instant invention. In the drawing, a disc 10 of p-type semiconducting antimony doped telluride and a second disc 15 of n-type mercury oxychloride characterized by the formula $2HgO \cdot HgCl_2$, are serially positioned and electrically connected by thermally and electrically conductive plate connectors 14*a*, 14*b* and 14*c*. The terminal plate connectors in this series (14*a* and 14*c*) are connected by electrical leads 12*a* and 12*b* into an external circuit comprising a power source 13, coupled with a current-controlling variable resistor 17.

Upon closing switch 18, current is caused to pass through the series arrangement of semiconductor discs 10 and 15 with the results that the upper plate connector 14*b* is cooled as illustrated by the $T_2$ vector directed into the plate connector 14*b*. The lower conducting plate connectors 14*a* and 14*c* are heated as shown by the outwardly directed $T_1$ vector.

Although the apparatus is schematically illustrated, modifications of this apparatus necessary to practically apply the cooling effect will be known to those skilled in the art. For instance, the plate connector 14*b*, or a number of such connectors in a given electrical series or number of different series, can be incorporated into the wall member of a refrigerator, frictional bearing or chemical reactor to produce desired cooling. Further arrangements for such cooling devices and the applications thereof are illustrated in U.S. Pat. Nos. 3,127,287; 3,074,242; and 3,095,330.

The mercury oxychlorides useful for the instant invention are prepared by any of several reaction techniques. One of the most convenient of these is the sintering method, which is carried out by dry mixing mercury oxide and mercury chloride and then heating the mixture at an elevated temperature to induce sintering. A portion of the chloride reactant may be replaced with mercury bromide, mercury iodide or mercury fluoride to produce the mercury oxy-mixed halides. The reactants are usually employed in stoichiometric proportions of about two moles of the mercury oxide for each mole of the mercury halide. The heating is conducted in the absence of air and moisture, preferably under an inert atmosphere, in a sealed tube within a temperature range from about 270° to about 350°C. At higher temperatures, a decomposition reaction begins to occur, while at lower temperatures, reaction times become excessively long.

Solution techniques for the preparation of mercury oxychlorides are described in the "Handbook of Preparative Inorganic Chemistry", Vol. 2, 2nd Edition, edited by G. Braver and by A. Schoch in the "American Journal of Chemistry", Vol. 29, page 32 (1903). These entail reacting aqueous suspensions of mercury oxide with a solution of mercury chloride containing sodium borate or sodium bicarbonate. When the mixed halides are desired, a portion of the mercury chloride is replaced with another mercury halide such as mercury bromide or iodide. These reaction mixtures produce a precipitate of mercury oxyhalide, as previously empirically characterized. This precipitate is recovered, dried and compressed into desirable shapes for use in thermoelectric assemblies.

The preferred method for preparing mercury oxychlorides produces an allotropic form of mercury oxyhalide of the foregoing empirical formula, which applicants believe to be novel. This process involves reacting mercury oxide and mercury chloride, or mixtures thereof, in the approximate weight proportion of at least about 1 to 10, preferably about 1 to 20, respectively. A mixture of these reactants above the minimal weight ratio is charged to a reaction vessel, which is evacuated, sealed and heated at an elevated temperature within a range from about 280° to about 350°C. The vessel containing the reaction mixture is heated until sufficient mercury chloride has distilled from the solution to cause crystallization of the desired mercury oxychloride in the reaction mixture remaining at the bottom of the reaction vessel. Thereafter, the reaction vessel is opened and the crystalline product removed. The crystals thus obtained are relatively large and capable of physical and electrical measurement in the form produced. Optionally, the crystals are fabricated into desired shapes.

Exemplary of p-type thermoelectric elements that may be used with the described mercury oxide chlorides in thermoelectric assemblies are carbon, copper, gold, silver, nickel, cobalt, iron, rhenium, vanadium, tungsten, molybdenum, hafnium, niobium, silicon, tantalum, beryllium and the oxides, borides, carbides, silicides and nitrides of the foregoing elements. Often such materials will be doped with small amounts of bismuth, tellurium, antimony and selenium. The better thermoelectric materials will be binary, ternary, and higher intermetallic mixtures of the foregoing elements. Preferably, the active p-type material will contain the elements in stoichiometric proportions, but non-stoichiometric mixtures may also be employed. The optimal proportion of a doping additive will vary, but is is generally less than about 15 percent by weight.

Conventionally, the fabrication of the thermoelectric materials into useful forms is accomplished by compacting the crystals in a mold of the desired shape. Pressures applied will vary but generally at least a minimal degree of consolidation and physical integrity will be achieved upon the application of pressures of 1000 pounds per square inch. Pressures up to as much as 20 to 30 thousand pounds per square inch may be employed. Optionally, the mold or means for compressing the mold, is heated to further facilitate compaction of the crystals.

The preparation and properties of the unique thermoelectric materials of the instant invention will be better understood by reference to the following examples.

EXAMPLE 1

Reagent grade mercury oxide and mercury chloride were mixed in a weight ratio of 20 parts by weight of the chloride for each part by weight of the oxide. The mixture was charged to a glass reaction vessel, which was evacuated and dried on the vacuum line for several hours. The reaction vessel was then sealed and placed in a heated zone, which provided a decreasing thermal gradient from top to bottom. When the bottom of the reaction vessel was at about 300°C., the mixture was molten and mercury oxide had dissolved in the excess mercruy chloride. As the reaction was continued, excess mercury chloride was evaporated and condensed in the cooler portion of the reaction vessel. Upon the distillation of sufficient mercury chloride, a crystalline product appeared in the bottom solution. After allowing sufficient time for most of the mercury oxide to have reacted, the crystalline product was recovered and dried.

Elemental analysis of the product revealed the crystalline composition to be 2HgO . $HgCl_2$. X-ray diffraction studies indicated unit cell dimensions of: $a$ = 10.8A; $b$ = 9.2A; $c$ = 11.5A; and $\beta$ = 108° 45'.

This product is significantly different from mercury oxychloride made by reaction of marble chips and $HgCl_2$ in aqueous solutions reported to have unit cell dimensions of: $a$ = 7.16 Å; $b$ = 6.87 Å; $c$ = 6.86 Å; and $\beta$ = 126° 10'. (See K Aurivillius, Arkiv For Kemi 23, 205 (1964.)

Single crystals of the mercury oxychloride thus produced were of sufficient size to facilitate the measurement of their electronic properties. The optical band gap was determined with a Beckman DK2 instrument for measuring the absorption spectrum. Conductivity and the Hall effect of the product were determined according to the method of Van der Pauw, Phillips Technical Review, Vol. 20 (1958). The Seebeck coefficient was measured according to a standard technique whereby a single crystal was clamped between two copper blocks within an evacuated container. The lower region of the container was cooled with ice water to induce a thermal gradient across the crystal. Temperatures were measured at crystal-copper block interfaces with copper-constantan thermocouples. Thermal conductivity was determined according to the method of Ioffe, "Physics of Semiconductors" Academic Press (1960) p. 337. The latter value, taken with the Seebeck coefficient was used for the computation of the thermoelectric figure of merit for the crystals.

The results of the foregoing measurements on several products prepared in the described manner are listed in the following Table 1.

Table 1

| Property | Value at 20°C | Range[a] |
|---|---|---|
| Specific conductivity | 14 $(ohm\ cm)^{-1}$ | 6 to 20$(ohm\ cm)^{-1}$ |
| Seebeck coeff. | −200 $\mu V/°K$ | −150 to −300$\mu V/°K$ |
| Hall coeff. | −1.43 $cm^3$/ coulomb | −1.36 to −1.69 $cm^3$/ coulomb |
| Optical band gap | approx. 1.8 ev. | |
| Thermal conductivity | approx. $5\times10^{-3}$ watt $cm^{-1}$ $deg^{-1}$ | |
| Thermoelectric figure of merit | approx. $2\times10^{-4}$ $deg^{-1}$ | |

[a]Refers to the range of values determined for at least 10 different crystals from different preparations.

EXAMPLES 2–12

Several mercury oxyhalide thermoelectric materials were prepared according to the sintering method. By this technique, mercury oxide and a mercury halide, such as mercury chloride, bromide, iodide, fluoride or mixtures of such halides, are blended to uniformity and heated in the absence of air and moisture at a temperature of about 300°C. The reaction conditions are maintained for a period of time sufficient to achieve sintering and diffusion of the reactants. An extended period of several days assures essentially complete reactions.

Mercury oxychloride, mercury oxybromide, mercury oxyiodide, mercury oxyfluoride and mixed mercury oxyhalides were prepared. The molar ratios of reactants charged for each run and the electronic properties, inclusive of the electrical conductivities, Seebeck coefficients, thermoconductivities and figures of merit are reported for a number of products prepared in this manner. The empirical formulas of the compounds and their major properties are reported in the following Table II.

Table II

| Material | Electrical Cond. $(ohm\ cm)^{-1}$ | Seebeck Coeff. $(\mu V/°K)$ | Thermal Cond. (mw/cm°K) | Figure of Merit $(°K)^{-1}$ |
|---|---|---|---|---|
| $2HgO.HgCl_2$ | 3.4 | −235 | 1.4 | $0.13 \times 10^{-3}$ |
| $2HgO(HgCl_2)_{0.87}(HgBr_2)_{0.13}$ | 2.7 | −245 | 1.9 | $0.85 \times 10^{-4}$ |
| $2HgO(HgCl_2)_{0.75}(HgBr_270.25$ | 2.5 | −270 | 3.1 | $0.60 \times 10^{-4}$ |
| $2HgO(HgCl_2)_{0.5}(HgBr_2)_{0.5}$ | 3.5 | −260 | 2.9 | $0.10 \times 10^{-3}$ |
| $2HgO(HgCl_2)_{0.25}(HgBr_2)_{0.75}$ | 5.4 | −170 | 1.6 | $0.98 \times 10^{-4}$ |
| $2HgO(HgCl_2)_{0.13}(HgBr_2)_{0.87}$ | 9.0 | −102 | (2) | est. $0.5 \times 10^{-4}$ |
| $2HgO.(HgCl_2)_{0.9}(HgI_2)_{0.1}$ | 1.7 | −330 | (2) | est. $0.9 \times 10^{-4}$ |
| $2HgO(HgCl_2)_{0.5}(HgF_2)_{0.5}$ | 15 | −100 | (2) | est. $0.7 \times 10^{-5}$ |
| $2HgO.HgBr_2$ | 17 | − 44 | 3.3 | $0.1 \times 10^{-4}$ |
| $2HgO.HgI_2$ | very low | — | — | very small |
| $2HgO.HgF_2$ | very low | — | — | very small |

Estimated uncertainties are, based on variations encountered among different preparations:
a) Thermal conductance ± 0.5 mw/cm°K.
b) Electrical conductance ± 1 $(ohm\ cm)^{-1}$
c) Seebeck coeff. ± 30 $\mu V/°K$.

What is claimed is:

1. In a thermocouple of the type comprising an n-type and a p-type thermoelectric element, which n- and p-type elements are in an electrical series arrangement and each element has a hot and a cold junction when current flows through the thermocouple, the improvement comprising an n-type thermoelectric element of a material characterized by the formula $2HgO \cdot (HgCl)_a \cdot (HgX_2)_b$ wherein X is a bromide, iodide or fluoride and $a$ is a number from 0.1 to 1, $b$ is a number from 0 to 0.9, and the sum of $a + b$ is equal to 1.

2. A thermoelectric device as in claim 1 wherein at least one of the n-type thermoelectric elements is a mercury oxychloride of the formula $2HgO \cdot HgCl_2$.

3. A thermoelectric device comprising an n-type and a p-type thermoelectric element, each having two electrically conductive cold junctions, conductor means for connecting one end of each of said elements to incorporate them in an electrical series and a power circuit connected to each end of the series by which a voltage can be applied across the series circuit of thermoelectric units whereby a cooling effect is induced in the cold junction connection, said n-type thermoelectric element being of a material characterized by the formula $2HgO \cdot (HgCl)_a \cdot (HgX_2)_b$ wherein X is a bromide, iodide or fluoride and $a$ is a number from 0.1 to 1, $b$ is a number from 0 to 0.9, and the sum of $a + b$ is equal to 1.

4. A thermoelectric device as in claim 3 wherein at least one of the n-type thermoelectric elements is a mercury oxychloride of the formula $2HgO \cdot HgCl_2$.

* * * * *